US008692558B2

(12) United States Patent
Shen

(10) Patent No.: US 8,692,558 B2
(45) Date of Patent: Apr. 8, 2014

(54) DISPLAY PANEL AND TESTING METHOD THEREOF

(75) Inventor: Chung-Ming Shen, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 336 days.

(21) Appl. No.: 13/189,557

(22) Filed: Jul. 24, 2011

(65) Prior Publication Data

US 2012/0262184 A1 Oct. 18, 2012

(30) Foreign Application Priority Data

Apr. 14, 2011 (TW) ............................. 100112993 A

(51) Int. Cl.
*G01R 31/02* (2006.01)

(52) U.S. Cl.
USPC ....... 324/537; 324/503; 324/522; 324/750.24

(58) Field of Classification Search
USPC ............................ 324/537, 503, 760.02, 522
See application file for complete search history.

(56) References Cited

U.S. PATENT DOCUMENTS 7,429,970 B2 9/2008 Tsai et al.
2007/0018680 A1* 1/2007 Jeon et al. .................... 324/770
2007/0120790 A1 5/2007 Jeon
2008/0074137 A1* 3/2008 Kim et al. .................... 324/770
2010/0014030 A1 1/2010 Lin
2011/0018571 A1 1/2011 Kim et al.

FOREIGN PATENT DOCUMENTS

| | | |
|---|---|---|
| CN | 101303462 | 11/2008 |
| CN | 101770122 | 7/2010 |
| CN | 101963709 | 2/2011 |
| TW | I232946 | 5/2005 |
| TW | M387342 | 8/2010 |

OTHER PUBLICATIONS

"First Office Action of China Counterpart Application", issued on Oct. 24, 2012, pp. 1-7, in which the listed references were cited.
"Office Action of Taiwan Counterpart Application", issued on Dec. 11, 2013, pp. 1-7, in which the listed reference was cited.

* cited by examiner

*Primary Examiner* — Vincent Q Nguyen
(74) *Attorney, Agent, or Firm* — Jianq Chyun IP Office

(57) ABSTRACT

A display panel and a testing method of the display panel are provided. The display panel has a display region and a non-display region and includes a first substrate, a second substrate, and a display medium. The display panel further includes scan lines, data lines, pixel units, at least one testing line, and at least one testing pad. The scan lines and the data lines are located on the first substrate within the display region. The pixel units are located on the first substrate within the display region. Each pixel unit electrically connects one of the scan lines and one of the data lines. The testing line is located on the first substrate within the non-display region, crosses over the scan lines, and is insulated from the scan lines. The testing pad is located on the first substrate within the non-display region and electrically connected to the testing line.

7 Claims, 8 Drawing Sheets

DISPLAY PANEL AND TESTING METHOD THEREOF

CROSS-REFERENCE TO RELATED APPLICATION

This application claims the priority benefit of Taiwan application serial no. 100112993, filed on Apr. 14, 2011. The entirety of the above-mentioned patent application is hereby incorporated by reference herein and made a part of this specification.

BACKGROUND OF THE INVENTION

1. Field of the Invention

The invention relates to a display panel and a testing method thereof.

2. Description of Related Art

In general, a conventional liquid crystal display (LCD) panel is constituted by a color filter (C/F), a thin film transistor (TFT) array substrate, and a liquid crystal layer sandwiched therebetween. Particularly, the TFT array substrate has an active region and a peripheral circuit region. A plurality of pixel arrays are disposed in the active region. Lead lines, bonding pads, and testing transistors are disposed in the peripheral circuit region.

When the TFT array substrate is being formed, electrical inspection is often performed on the pixel arrays that are located on a substrate, so as to determine whether the pixels in the pixel arrays function well. During electrical inspection on the pixel arrays, if a bright line defect or a dark line defect is detected, the scan line having the line defect is usually required to be further tested. The testing method includes inputting a specific signal to the scan line having the line defect and receiving an output signal from the end of the scan line. The cause of the line defect can be confirmed by analyzing the output signal.

At present, the output signal at the end of the scan line is measured by directly contacting the end of the scan line with use of a probe to receive the output signal. In order to allow the probe to be in contact with the end of the scan line, a glass substrate located above the end of the scan line often needs to be cleaved and pierced in a destructive manner, so as to expose the end of the scan line. Thereby, the inspection procedure becomes more complicated, and significant time is required to be spent on inspection. Moreover, it is difficult to accurately and successfully cleave and pierce the glass substrate.

SUMMARY OF THE INVENTION

The invention is directed to a display panel and a testing method of the display panel. When the display panel is found to have a line defect, and inspection is required to be performed on a corresponding scan line, it is not necessary to cleave and pierce a substrate, while an output signal of the scan line can still be detected and measured.

In an embodiment of the invention, a display panel is provided. The display panel has a display region and a non-display region. Besides, the display panel includes a first substrate, a second substrate, and a display medium. The display panel further includes a plurality of scan lines, a plurality of data lines, a plurality of pixel units, at least one testing line, and at least one testing pad. The scan lines and the data lines are located on the first substrate within the display region. The pixel units are located on the first substrate within the display region. Each of the pixel units is electrically connected to one of the scan lines and one of the data lines. The testing line is located on the first substrate within the non-display region, crosses over the scan lines, and is insulated from the scan lines. The testing pad is located on the first substrate within the non-display region and electrically connected to the testing line.

In an embodiment of the invention, a testing method of a display panel is provided. In the testing method, the aforesaid display panel is provided. Here, one of the scan lines in the display panel has a line defect. A melting and connecting process is performed on an area where the testing line crosses over the scan line having the line defect, such that the testing line is electrically connected to the scan line having the line defect. A testing signal is input to the scan line having the line defect, and an output signal received from the testing pad is measured.

Based on the above, the testing line and the testing pad are disposed in the non-display region, and the testing line crosses over the scan lines, as described in the embodiments of the invention. When one of the scan lines in the display panel is found to have a line defect, the melting and connecting process can be directly performed on an area where the testing line crosses over the scan line having the line defect, such that the testing line is electrically connected to the scan line having the line defect. After the testing signal is input to the scan line having the line defect, the testing signal can be transmitted to the testing pad through the defective scan line and the testing line. Thus, the output signal received from the testing pad can be directly measured. That is to say, it is not necessary to cleave and pierce the substrate in the display panel described in the embodiments of the invention, and the output signal of the scan line can still be measured.

In order to make the aforementioned and other features and advantages of the invention more comprehensible, embodiments accompanying figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DESCRIPTION OF EMBODIMENTS

Figure 1:
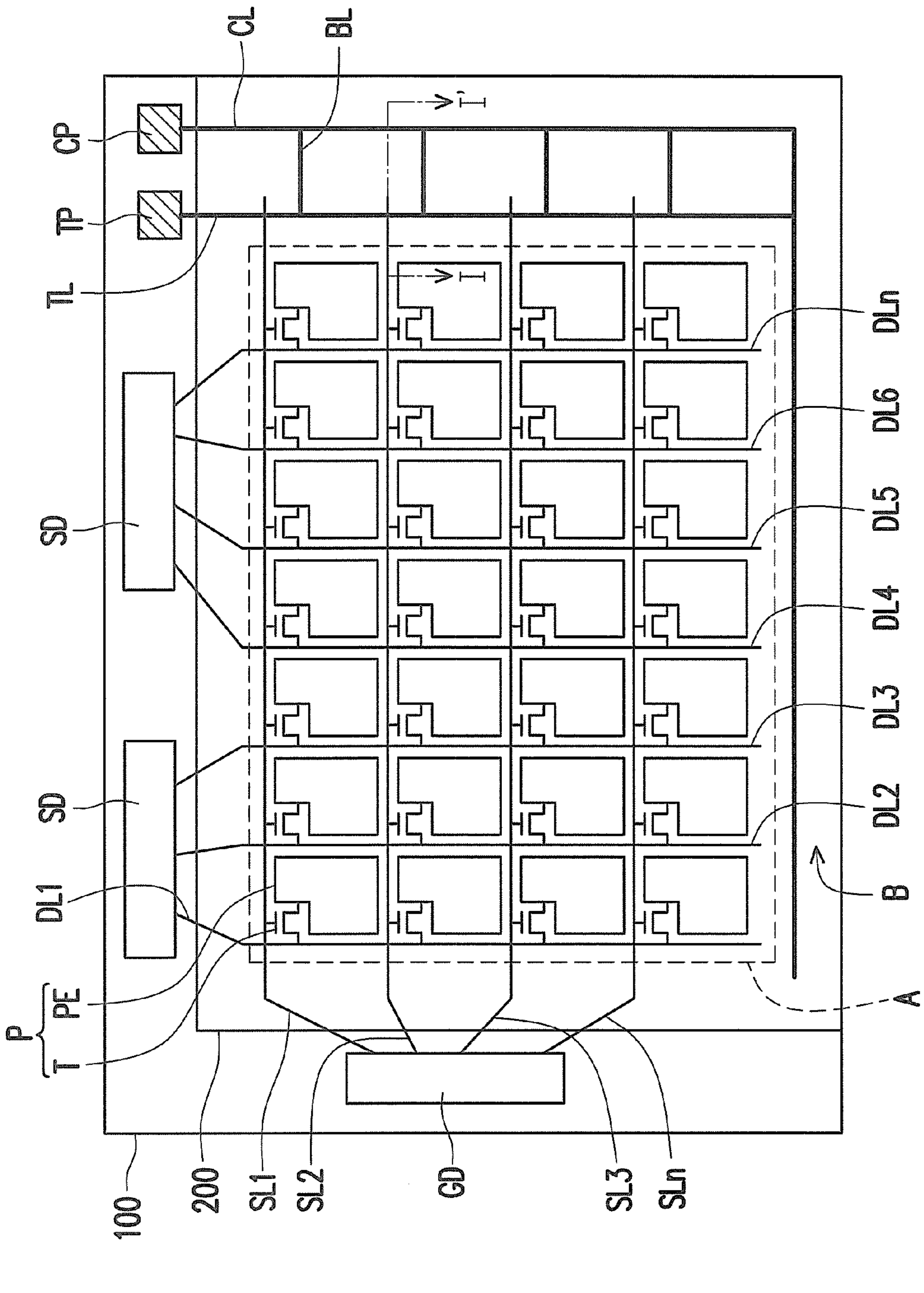
FIG. 1 is a schematic top view illustrating a display panel according to an embodiment of the invention.
Figure 2:
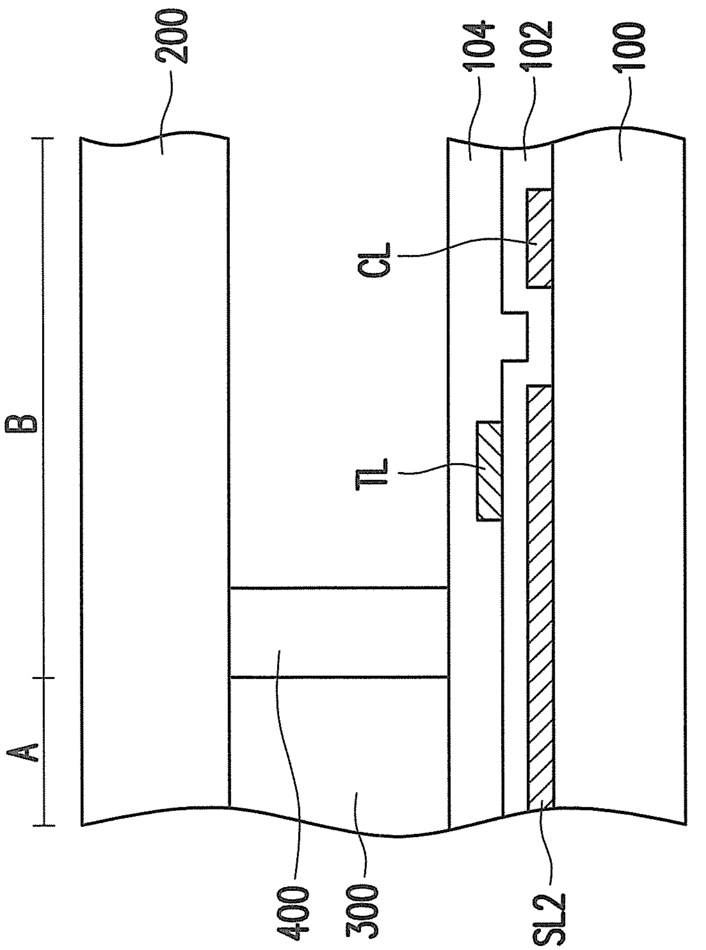
FIG. 2 is a schematic cross-sectional view taken along a sectional line I-I' depicted in FIG. 1.

FIG. 1 is a schematic top view illustrating a display panel according to an embodiment of the invention. FIG. 2 is a schematic cross-sectional view taken along a sectional line I-I' depicted in FIG. 1. With reference to FIG. 1 and FIG. 2, the display panel of this embodiment has a display region A and a non-display region B. Besides, the display panel includes a first substrate 100, a second substrate 200, and a display medium 300 located between the first and second substrates 100 and 200. The display panel further includes a plurality of scan lines SL1~SLn, a plurality of data lines DL1~DLn, a plurality of pixel units P, at least one testing line TL, and at least one testing pad TP.

The first substrate 100 and the second substrate 200 are opposite to each other. In addition, the first and second substrates 100 and 200 can be transparent substrates. Alternatively, one of the first and second substrates 100 and 200 is a transparent substrate, while the other is a non-transparent substrate. The first and second substrates 100 and 200 can be made of glass, quartz, an organic polymer, an opaque/reflective material (such as a conductive material, metal, wafer, ceramics, or any other appropriate material), or any other appropriate material. Generally, in order to bond the first and second substrates 100 and 200 together and form an accommodation space between the first and second substrates 100 and 200, a sealing adhesive (i.e., a sealant) 400 is often placed in the non-display region B between the first and second substrates 100 and 200.

According to this embodiment, the second substrate 200 is located above the first substrate 100, and the area of the second substrate 200 is smaller than the area of the first substrate 100. Therefore, after the first and second substrates 100 and 200 are bonded together, the first substrate 100 is not completely covered by the second substrate 200. In other words, the non-display region B on the first substrate 100 is partially exposed and is not covered by the second substrate 200. In the embodiment shown in FIG. 1, the non-display region B at the upper and left corners of the first substrate 100 is not covered by the second substrate 200, which should not be construed as a limitation to the invention.

The display medium 300 is sandwiched between the first substrate 100 and the second substrate 200. To be more specific, the display medium 300 is located in the accommodation space defined by the first substrate 100, the second substrate 200, and the sealing adhesive 400. The display medium 300 includes liquid crystal molecules, an electrophoretic display medium, an organic electroluminescent display medium, an electrowetting display medium, or any other applicable medium.

The scan lines SL1~SLn and the data lines DL1~DLn are located on the first substrate 100 within the display region A. In this embodiment, the scan lines SL1~SLn cross over the data lines DL1~DLn, and an insulation layer is sandwiched between the scan lines SL1~SLn and the data lines DL1~DLn. That is to say, extension directions of the data lines DL1~DLn are not parallel to extension directions of the scan lines SL1~SLn. Preferably, the extension directions of the data lines DL1~DLn are perpendicular to the extension directions of the scan lines SL1~SLn. In addition, the scan lines SL1~SLn and the data lines DL1~DLn are in different layers. In consideration of electrical conductivity, the data lines DL1~DLn and the scan lines SL1~SLn are often made of metal materials. However, the invention is not limited thereto. According to other embodiments of the invention, the scan lines SL1~SLn and the data lines DL1~DLn can also be made of other conductive materials. The metal material includes, for example, an alloy, metal nitride, metal oxide, metal oxynitride, another appropriate material, or a layer in which the metal material and any other conductive material are stacked to each other.

The pixel units P are located on the first substrate 100 within the display region A. Each of the pixel units P is electrically connected one of the scan lines SL1~SLn and one of the data lines DL1~DLn. According to this embodiment, each of the pixel units P includes a switch device T and a pixel electrode PE. Each of the switch devices T is electrically connected to a corresponding one of the scan lines SL1~SLn and a corresponding one of the data lines DL1~DLn, and the pixel electrodes PE are electrically connected to the switch devices T. The switch devices T can be bottom-gate TFTs or top-gate TFTs, and each of the switch devices T includes a gate, a channel, a source, and a drain.

The testing line TL is located on the first substrate 100 within the non-display region B. In particular, the scan lines SL1~SLn cross over the testing line TL and are electrically insulated from the testing line TL. That is to say, an insulation layer 102 is sandwiched between the testing line TL and the scan lines SL1~SLn. Besides, an insulation layer 104 can further cover the testing line TL. As stated above, the scan lines SL1~SLn cross over the testing line TL, and the scan lines SL1~SLn are electrically insulated from the testing line TL. Thus, the scan lines SL1~SLn and the testing line TL are in different layers. According to this embodiment, the testing line TL is located above the scan lines SL1~SLn, and the insulation layer 102 is sandwiched between the testing line TL and the scan lines SL1~SLn. However, the invention is not limited thereto. According to other embodiments of the invention, the testing line TL can be located below the scan lines SL1~SLn, and an insulation layer is sandwiched between the testing line TL and the scan lines SL1~SLn.

In this embodiment, the testing line TL mainly serves to transmit signals, and thus it is not necessary to configure TFTs or other switch devices on the testing line TL. As a result, the testing line TL of this embodiment does not occupy significant space in the non-display region B of the display panel, and the complexity of fabrication is not increased.

The testing pad TP is located on the first substrate 100 within the non-display region B, and the testing pad TP is electrically connected to the testing line TL. To be more specific, the testing pad TP is located on the first substrate 100 and is not covered by the second substrate 200. In consideration of the location of the testing line TL, the testing pad TP of this embodiment is disposed in the non-display region B above the first substrate 100.

The display panel of this embodiment further includes at least one driving device that can include a gate driving device GD and a source driving device SD. The gate and source driving devices GD and SD are located on the first substrate 100 within the non-display region B. The gate driving device GD is electrically connected to the scan lines SL1~SLn, and the source driving device SD is electrically connected to the data lines DL1~DLn. Particularly, the gate and source driving devices GD and SD are disposed on the first substrate 100 within the non-display region B. The scan lines SL1~SLn and the data lines DL1~DLn respectively extend from the display region A to the non-display region B, so as to be electrically connected to the gate driving device GD and the source driving device SD, respectively. Therefore, driving signals of the gate and source driving devices GD and SD can be transmitted to the pixel units P in the display region A through the scan lines SL1~SLn and the data lines DL1~DLn, such that the pixel units P are driven.

In this embodiment, the driving device refers to the exemplary gate and source driving devices GD and SD located at two sides of the display region A. However, the invention is not limited thereto. In other embodiments of the invention, the driving device can be disposed at one side of the display region A, at three sides of the display region A, or at the periphery of the display region A.

In the embodiment shown in FIG. 1 and FIG. 2, the display panel further includes a common voltage line CL and a common voltage pad CP for providing the common voltage to the display panel. For instance, the common voltage is applied to one electrode (e.g., the upper electrode) of the storage capacitor in the pixel unit P of the first substrate 100 and is applied to the electrode layer on the second substrate 200. The common voltage signal can be input through the common voltage pad CP and transmitted to the electrodes (i.e., the electrode of the storage capacitor and the electrode layer on the second substrate 200) through the common voltage line CL. The common voltage line CL is located on the first substrate 100 within the non-display region B and disposed adjacent to the testing line TL. As indicated in FIG. 1, the common voltage line CL is parallel to the testing line TL. The common voltage pad CP is located on the first substrate 100 within the non-display region B and electrically connected to the common voltage line CL. Here, the common voltage pad CP is located on the first substrate 100 and is not covered by the second substrate 200. Similarly, in consideration of the location of the common voltage line CL, the common voltage pad CP of this embodiment is disposed in the non-display region B above the first substrate 100.

The testing line TL is electrically connected to the common voltage line CL in this embodiment. In order to electrically connect the testing line TL to the common voltage line CL, bridge lines BL can be disposed between the testing line TL and the common voltage line CL. Given the testing line TL and the common voltage line CL are in the same layer, two ends of each bridge line BL can be directly connected to the testing line TL and the common voltage line CL, such that the testing line TL is electrically connected to the common voltage line CL. However, given the testing line TL and the common voltage line CL are in different layers, contact holes can be disposed at two ends of each bridge line BL, such that the testing line TL is electrically connected to the common voltage line CL.

In view of the above, the testing line TL is electrically connected to the common voltage line CL but electrically insulated from the scan lines SL1~SLn according to this embodiment. Thus, the testing line TL and the common voltage line CL have a common potential. Namely, when a common voltage Vcom is applied to the common voltage line CL, the testing line TL can have the common voltage Vcom as well.

In most cases, after the display panel is formed, a series of electrical inspection procedures is carried out. When one of the scan lines is found to have a line defect during the electrical inspection, the defective scan line is often required to be further inspected. The line defect herein refers to abnormal line images in the display region of the display panel and can be a bright line defect, a faint line defect, a dark line defect, and so on. Besides, the line defect is often caused by manufacturing errors in the corresponding scan line or the like. When one of the scan lines in the display panel is found to have the line defect, a testing method is further applied to inspect the defective scan line, and the testing method is described below.

Figure 3:
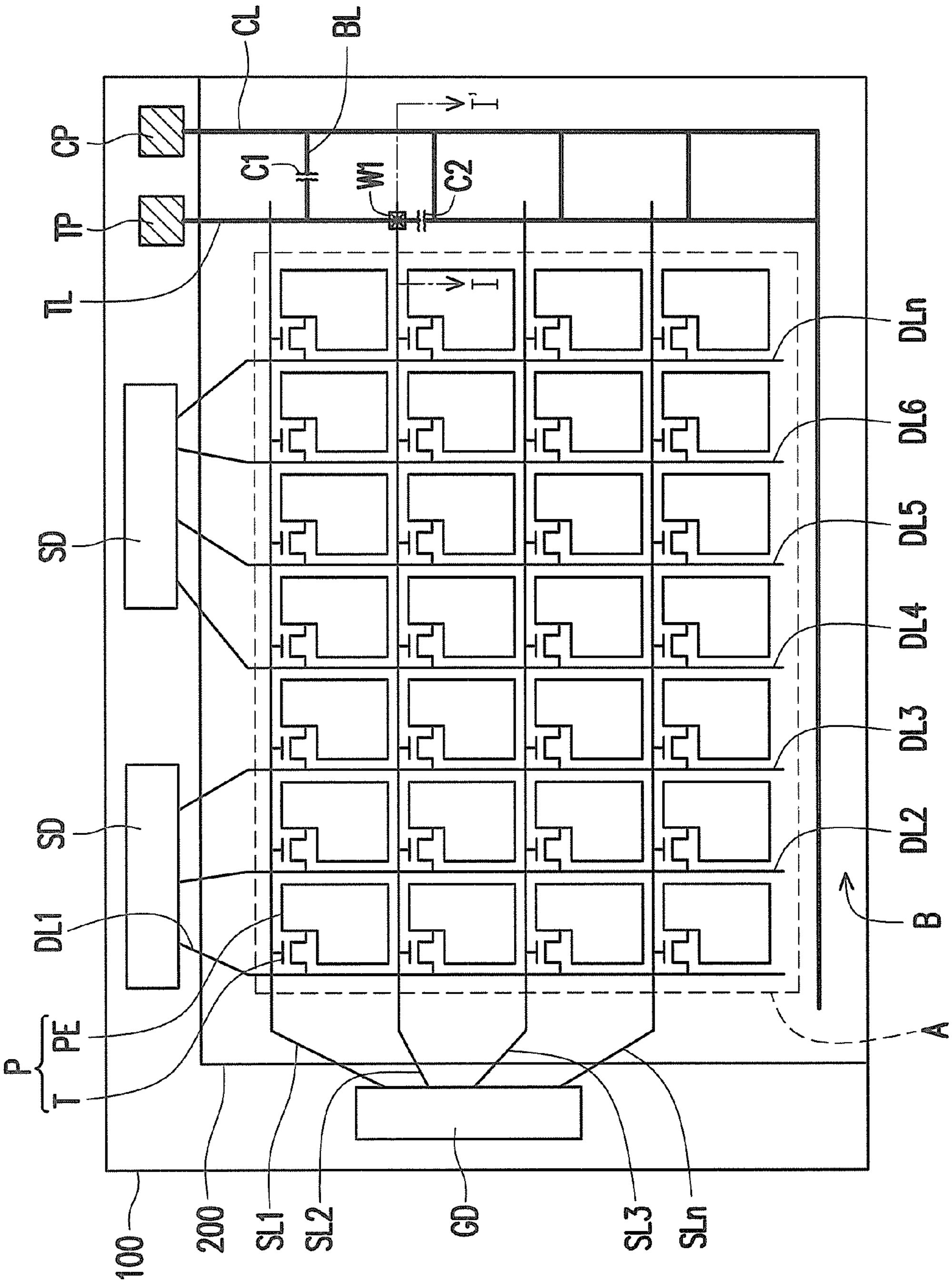
FIG. 3 is a schematic view of inspecting the display panel depicted in FIG. 1.
Figure 4:
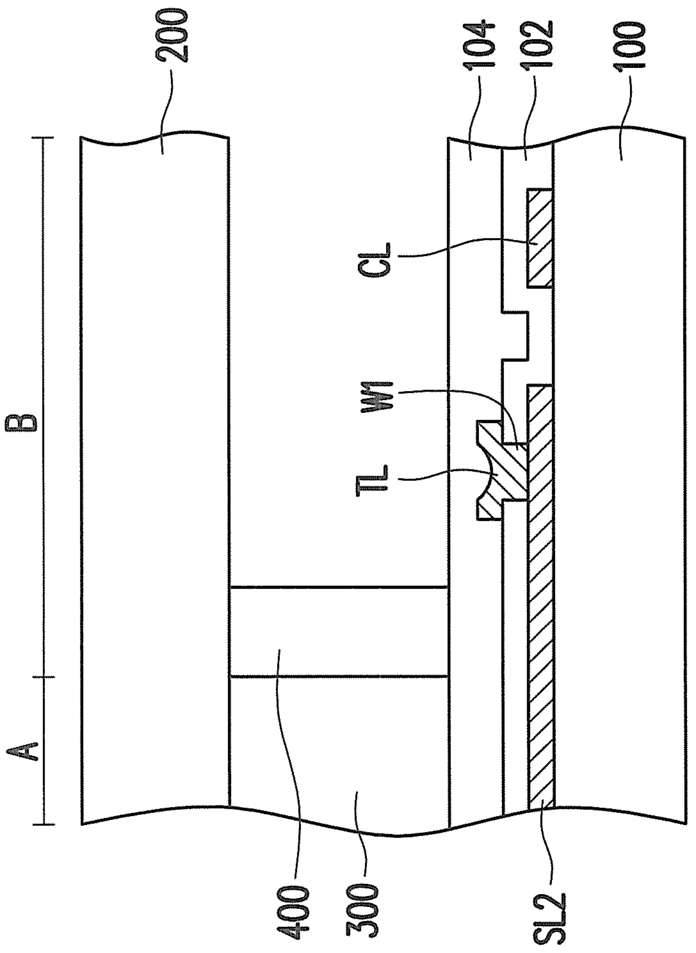
FIG. 4 is a schematic cross-sectional view taken along a sectional line I-I' depicted in FIG. 3.

FIG. 3 is a schematic view of inspecting the display panel depicted in FIG. 1. FIG. 4 is a schematic cross-sectional view taken along a sectional line I-I' depicted in FIG. 3. With reference to FIG. 3 and FIG. 4, when one of the scan lines (e.g., the scan line SL2) in the display panel is found to have the line defect, a melting and connecting process is performed on an area where the scan line SL2 crosses over the testing line TL, so as to electrically connect the testing line TL and the scan line SL2. The area herein refers to a melting area W1. According to this embodiment, the melting and connecting process can be a laser melting and connecting process or any other appropriate melting and connecting process.

The testing line TL and the bridge lines BL at the cutting areas C1 and C2 can be cut off, such that the testing line TL is electrically insulated from the common voltage line CL. A method of cutting the testing line TL and the bridge lines BL at the cutting areas C1 and C2 can include a laser cutting process or any other appropriate cutting process.

At this time, the testing line TL is electrically insulated from the common voltage line CL due to implementation of the cutting process, and thus the testing line TL no longer receives the common voltage signal. Besides, the scan line SL2 and the testing line TL are electrically connected due to implementation of the melting and connecting process, and thus the signal on the scan line SL2 can be transmitted to the testing line TL.

A testing signal is input to the scan line SL2. Since the scan line SL2 is electrically connected to the gate driving device GD, the testing signal is input to the scan line SL2 from the gate driving device GD. The testing signal is transmitted to the testing line TL through the scan line SL2 and then transmitted to the testing pad TP from the testing line TL. Hence, the corresponding output signal received from the testing pad TP can be measured. By comparing and analyzing the output signal and the testing signal, the cause of the line defect of the scan line SL2 can be further determined.

It should be mentioned that the testing pad TP is located on the first substrate 100 and is not covered by the second substrate 200. Accordingly, the probe can be used to directly contact the testing pad TP in this embodiment, and thereby the output signal can be detected and measured. In other words, it is not necessary to cleave or pierce any substrate of the display panel in a destructive manner according to this embodiment.

As described in the previous embodiments (shown in FIG. 1 to FIG. 4), the testing line TL is electrically connected to the common voltage line CL. Therefore, after the melting and connecting process is performed on the area where the scan line SL2 crosses over the testing line TL to electrically connect the testing line TL and the scan line SL2, the testing line TL and the bridge lines BL need to be further cut off, so as to electrically insulate the testing line TL from the common voltage line CL. The testing signal is then input to the scan line SL2, and the corresponding output signal received from the testing pad TP is measured. However, in other embodiments of the invention, it is assumed that the testing line TL is independent, i.e., the testing line TL is not electrically connected to the common voltage line CL. After the melting and connecting process is performed on the area where the scan line SL2 crosses over the testing line TL to electrically connect the testing line TL and the scan line SL2, the step of cutting the testing line TL can be omitted. That is to say, after the melting and connecting process is performed, the testing signal can be directly input to the scan line SL2, and the corresponding output signal received from the testing pad TP can be measured.

Figure 5:
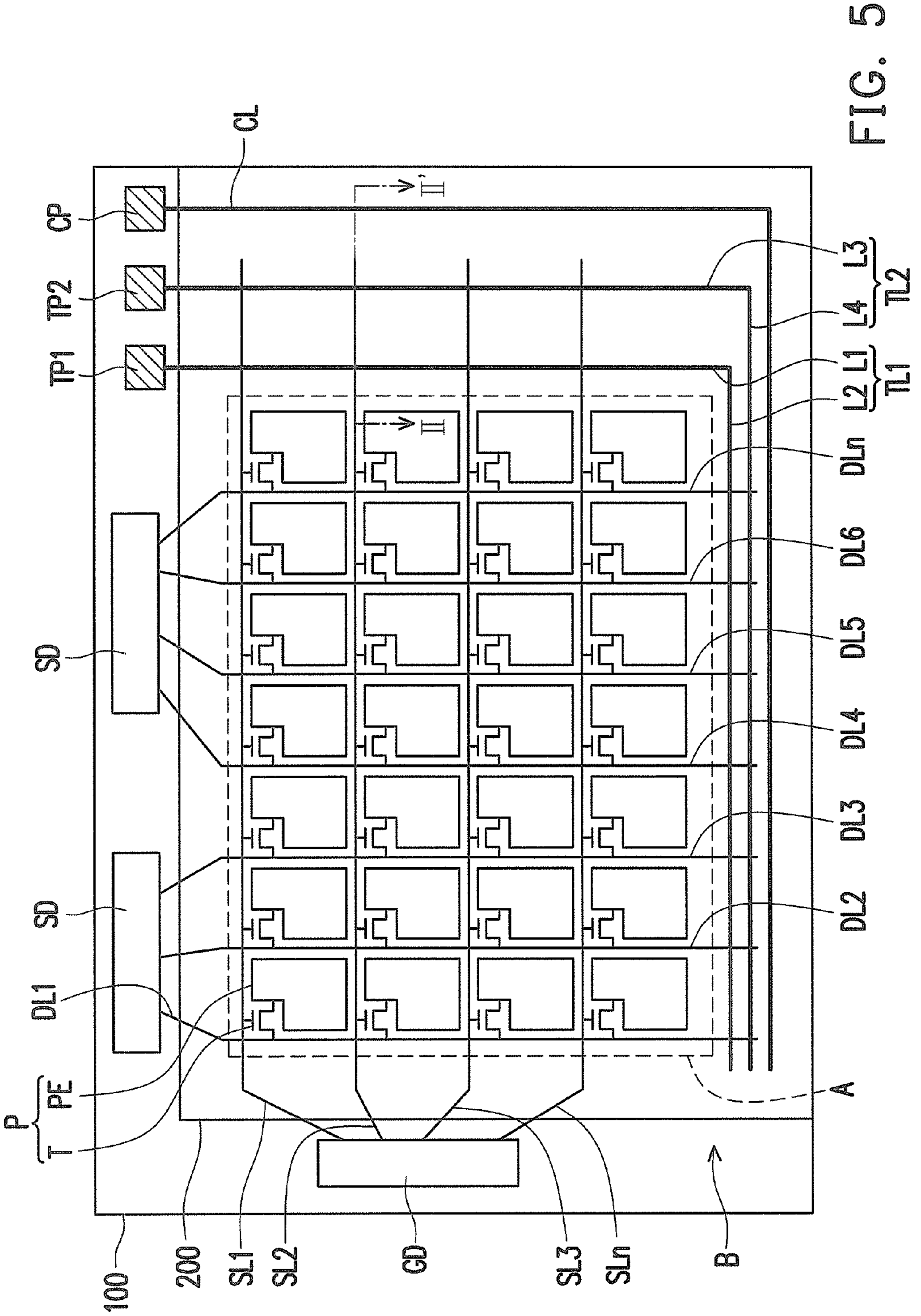
FIG. 5 is a schematic top view illustrating a display panel according to an embodiment of the invention.
Figure 6:
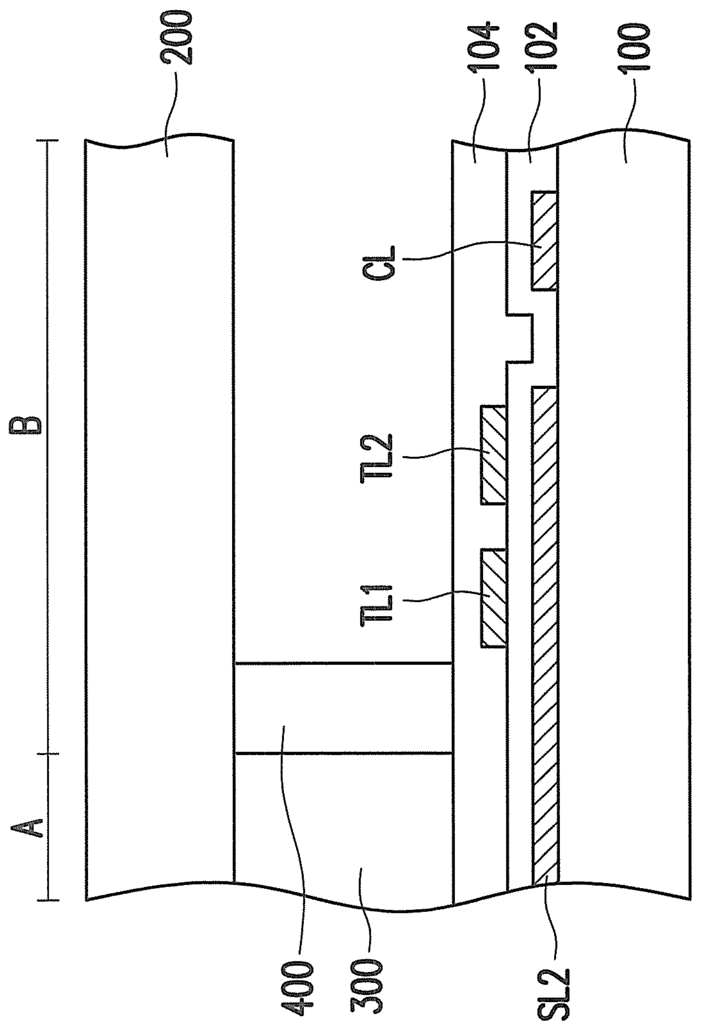
FIG. 6 is a schematic cross-sectional view taken along a sectional line II-II' depicted in FIG. 5.

FIG. 5 is a schematic top view illustrating a display panel according to another embodiment of the invention. FIG. 6 is a schematic cross-sectional view taken along a sectional line II-II' depicted in FIG. 5. With reference to FIG. 5 and FIG. 6, the embodiment shown herein is similar to the embodiment shown in FIG. 1 and FIG. 2, and thus the same components in these drawings are denoted by the same numerals and are not reiterated herein. The difference between this embodiment and the embodiment shown in FIG. 1 and FIG. 2 lies in that a built-in rescue line on the display panel can serve as the testing line for transmitting the testing signal. Alternatively, the testing line can act as the rescue line in this embodiment. When circuit defects or device defects are found through the inspection procedure performed on the display panel, the rescue line is often applied to rectify the defects, so as to improve yield of products.

According to this embodiment, the testing lines TL1 and TL2 disposed on the first substrate 100 within the non-display region B can both act as rescue lines for repairing the data lines. For said purpose, the testing lines TL1 and TL2 cross over the data lines DL1~DLn according to this embodiment. In other words, when specific data lines are subsequently found to have defects, the testing lines TL1 and TL2 can replace the defective data lines. Two testing lines TL1 and TL2 are exemplified in this embodiment, while the number of the testing lines is not limited in the invention. Similarly, the testing lines TL1 and TL2 can be simple conductive lines, and it is not necessary to configure TFTs or other switch devices on the testing lines TL1 and TL2.

Therefore, in this embodiment, the design of the testing lines TL1 and TL2 is further improved. Namely, the testing lines TL1 and TL2 cross over the data lines DL1~DLn in order for the testing lines TL1 and TL2 to act as the rescue lines of the defective data lines. Moreover, the testing lines TL1 and TL2 cross over the scan lines SL1~SLn in order to transmit signals on the scan lines SL1~SLn.

Specifically, in this embodiment, the testing line TL1 includes a first portion L1 and a second portion L2, and the testing line TL2 includes a first portion L3 and a second portion L4. The first portions L1 and L3 of the testing lines TL1 and TL2 cross over the scan lines SL1~SLn. Besides, the first portions L1 and L3 of the testing lines TL1 and TL2 are electrically insulated from the scan lines SL1~SLn and electrically connected to the testing pads TP1 and TP2. The second portions L2 and L4 of the testing lines TL1 and TL2 cross over the data lines DL1~DLn. Besides, the second portions L2 and L4 of the testing lines TL1 and TL2 are electrically insulated from the data lines DL1~DLn. Based on this embodiment, the extension directions of the first portions L1 and L3 of the testing lines TL1 and TL2 are substantially perpendicular to the extension directions of the scan lines SL1~SLn; the extension directions of the second portions L2 and L4 of the testing lines TL1 and TL2 are substantially perpendicular to the extension directions of the data lines DL1~DLn.

If the inspection result of the display panel indicates that the data lines DL1~DLn are not defective, and it is not necessary to repair the data lines DL1~DLn, then the testing lines TL1 and TL2 can transmit signals on the scan lines SL1~SLn. By contrast, if the inspection result of the display panel indicates that a specific data line needs to be repaired, and the testing line TL1 is applied for repairing the defective data line, then the testing line TL2 is employed to transmit signals on the scan lines when the scan lines are subsequently required to be tested.

Similarly, the display panel of this embodiment also includes a common voltage line CL and a common voltage pad CP for supplying the display panel with the common voltage. In this embodiment, the common voltage line CL and the testing lines TL1 and TL2 are parallel, and the common voltage line CL is electrically insulated from the testing lines TL1 and TL2. Since the testing lines TL1 and TL2 are likely to replace the defective data lines and transmit signals on the defective data lines, the testing lines TL1 and TL2 are electrically insulated from the common voltage line CL.

Similarly, when one of the scan lines in the display panel is found to have the line defect (e.g., a bright line defect, a faint line defect, or a dark line defect), the testing method performed on the scan line having the line defect is described below.

Figure 7:
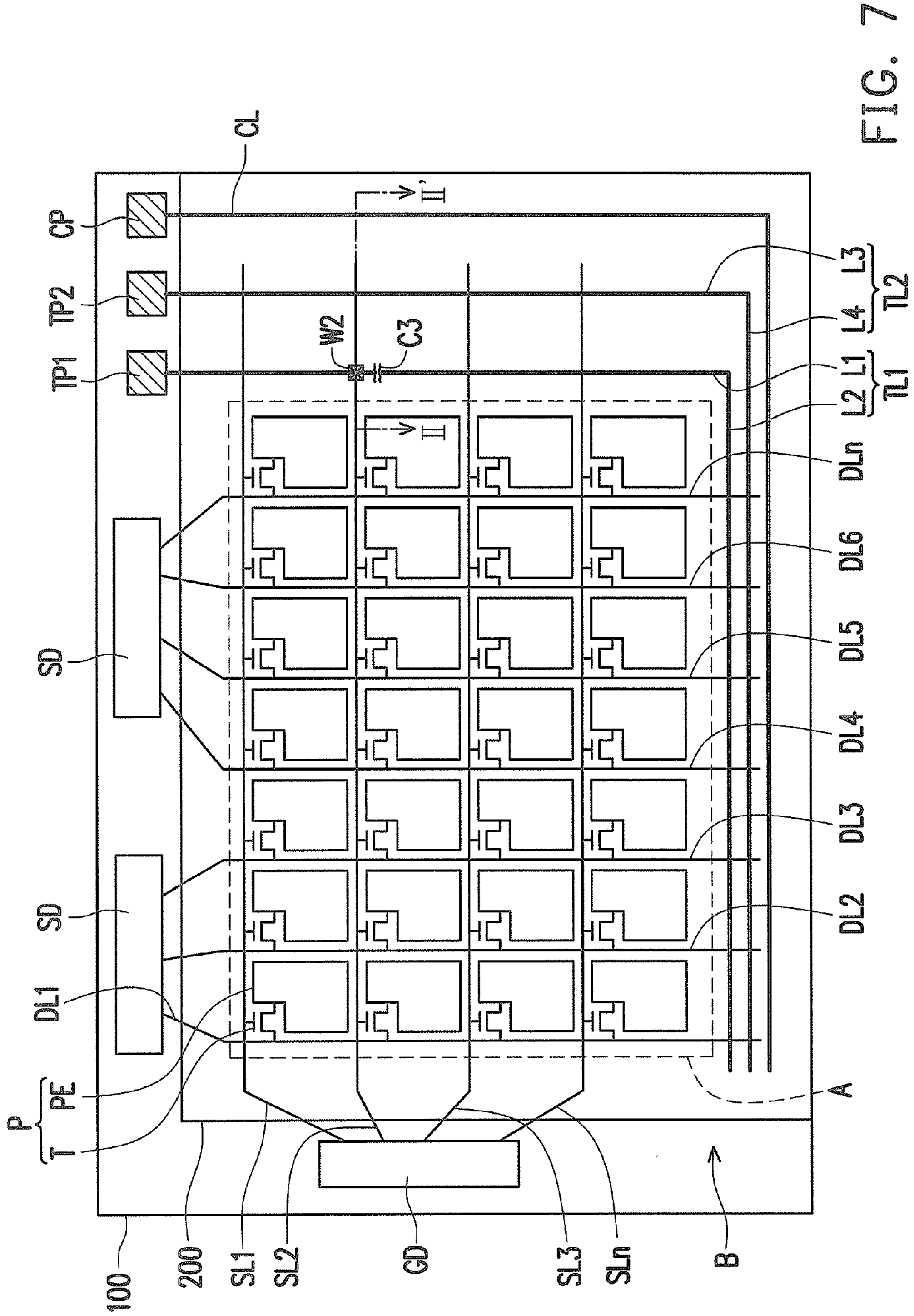
FIG. 7 is a schematic view of inspecting the display panel depicted in FIG. 5.
Figure 8:
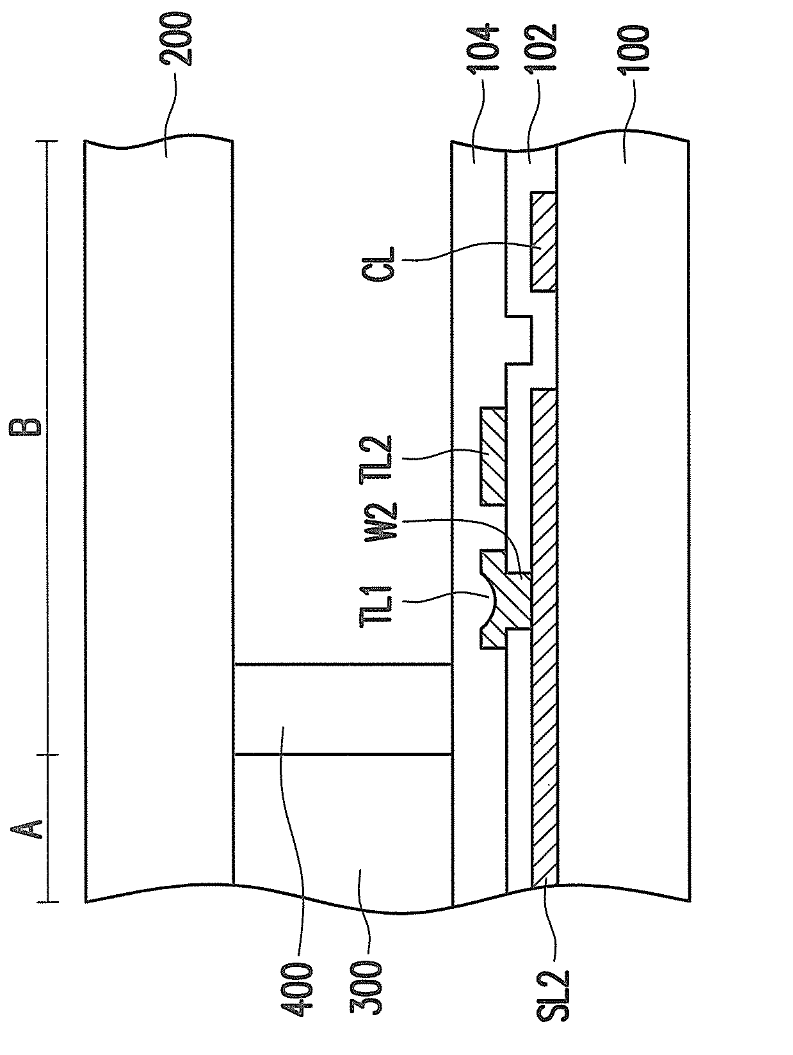
FIG. 8 is a schematic cross-sectional view taken along a sectional line II-II' depicted in FIG. 7.

FIG. 7 is a schematic view of inspecting the display panel depicted in FIG. 5. FIG. 8 is a schematic cross-sectional view taken along a sectional line II-IF depicted in FIG. 7. With reference to FIG. 7 and FIG. 8, when one of the scan lines (e.g., the scan line SL2) in the display panel is found to have the line defect, a melting and connecting process is performed on an area where the scan line SL2 crosses over the first portion L1 of the testing line TL1, so as to electrically connect the testing line TL1 and the scan line SL2. The area herein refers to a melting area W2. According to this embodiment, the melting and connecting process can be a laser melting and connecting process or any other appropriate melting and connecting process.

Besides, the testing line TL1 at the cutting area C3 can be cut off. A method of cutting the testing line TL1 at the cutting area C3 can include a laser cutting process or any other appropriate cutting process. At this time, the scan line SL2 and the testing line TL1 are electrically connected due to implementation of the melting and connecting process, and the signal on the scan line SL2 can be transmitted to the testing line TL1.

A testing signal is input to the scan line SL2. Since the scan line SL2 is electrically connected to the gate driving device GD, the testing signal is input to the scan line SL2 from the gate driving device GD. The testing signal is transmitted to the testing line TL1 through the scan line SL2 and then transmitted to the testing pad TP from the testing line TL1. Hence, the corresponding output signal received from the testing pad TP can be measured. By comparing and analyzing the output signal and the testing signal, the cause of the line defect of the scan line SL2 can be further determined.

In another embodiment of the invention, the step of cutting the testing line TL1 at the cutting area C3 can be omitted. The testing line TL1 is not electrically connected to other conductive wires before the melting and connecting process is performed. Accordingly, after the melting and connecting process is carried out, the step of cutting the testing line TL1 at the cutting area C3 can be omitted, the testing signal can be directly input to the scan line SL2, and the output signal received from the testing pad TP can be measured.

In this embodiment, the testing line TL1 serves to transmit the testing signal on the scan line SL2. However, in other embodiments of the invention, the testing line TL2 can also serve to transmit the testing signal on the scan line SL2.

In light of the foregoing, the testing line and the testing pad are disposed in the non-display region, and the testing line crosses over the scan lines, as described in the embodiments of the invention. When one of the scan lines in the display panel is found to have a line defect, the melting and connecting process can be directly performed on an area where the testing line crosses over the scan line having the line defect, such that the testing line is electrically connected to the scan line having the line defect. After the testing signal is input to the scan line having the line defect, the testing signal can be transmitted to the testing pad through the defective scan line and the testing line. Thus, the output signal received from the testing pad can be directly measured. That is to say, it is not necessary to cleave and pierce the substrate in the display panel described in the embodiments of the invention, and the output signal of the scan line can still be measured.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A display panel having a display region and a non-display region, the display panel comprising:

a first substrate, a second substrate, and a display medium located between the first substrate and the second substrate;

a plurality of data lines and a plurality of scan lines, the scan lines and the data lines being located on the first substrate within the display region;

a plurality of pixel units located on the first substrate within the display region, each of the pixel units being electrically connected to one of the scan lines and one of the data lines;

at least one testing line located on the first substrate within the non-display region, the scan lines crossing over the at least one testing line and being electrically insulated from the at least one testing line;

at least one testing pad located on the first substrate within the non-display region, the at least one testing pad being electrically connected to the at least one testing line;

a common voltage line located on the first substrate within the non-display region and disposed adjacent to the at least one testing line; and a common voltage pad located on the first substrate within the non-display region and electrically connected to the common voltage line, wherein the at least one testing line is electrically connected to the common voltage line.

2. The display panel as claimed in claim 1, wherein the at least one testing line comprises a first portion and a second portion, the first portion of the at least one testing line crosses over the scan lines, is electrically insulated from the scan lines, and is electrically connected to the at least one testing pad, and the second portion of the at least one testing line crosses over the data lines and is electrically insulated from the data lines.

3. The display panel as claimed in claim 2, further comprising:

a common voltage line located on the first substrate within the non-display region and disposed adjacent to the at least one testing line; and a common voltage pad located on the first substrate within the non-display region and electrically connected to the common voltage line.

4. The display panel as claimed in claim 1, wherein the at least one testing pad is located on the first substrate and is not covered by the second substrate.

5. The display panel as claimed in claim 1, further comprising at least one driving device located on the first substrate within the non-display region, the scan lines and the data lines being electrically connected to the at least one driving device.

6. The display panel as claimed in claim 1, wherein no switch devices are configured between the at least testing line and the scan lines.

7. The display panel as claimed in claim 1, further comprising a bridge line disposed between the at least one testing line and the common voltage line, wherein the bridge line connects the at least one testing line and the common voltage line.

* * * * *